United States Patent
Wu et al.

(10) Patent No.: US 8,283,983 B2
(45) Date of Patent: Oct. 9, 2012

(54) FREQUENCY CALIBRATION DEVICE AND METHOD FOR PROGRAMMABLE OSCILLATOR

(75) Inventors: Chih Yen Wu, Science-Based Industrial Park Hsin-Chu (TW); Chien Jung Huang, Science-Based Industrial Park Hsin-Chu (TW); Hsiang Sheng Liu, Science-Based Industrial Park Hsin-Chu (TW); Ching Chih Chen, Science-Based Industrial Park Hsin-Chu (TW)

(73) Assignee: PixArt Imaging Inc., Hsin-chu (TW)

( * ) Notice: Subject to any disclaimer, the term of this patent is extended or adjusted under 35 U.S.C. 154(b) by 19 days.

(21) Appl. No.: 12/948,265

(22) Filed: Nov. 17, 2010

(65) Prior Publication Data
US 2011/0115568 A1    May 19, 2011

(30) Foreign Application Priority Data
Nov. 18, 2009 (TW) .................. 98139076 A

(51) Int. Cl.
*H03L 7/06* (2006.01)
*G06F 1/04* (2006.01)

(52) U.S. Cl. ............ 331/1 A; 331/25; 713/503; 327/160
(58) Field of Classification Search .................. 331/44, 331/1 A, 34, 16, 17, 1 R; 327/159, 166, 160, 327/299; 375/226, 220, 371, 373, 376; 713/500–503
See application file for complete search history.

(56) References Cited

U.S. PATENT DOCUMENTS
6,407,641 B1 * 6/2002 Williams et al. ............. 331/1 A
* cited by examiner

*Primary Examiner* — Ryan Johnson

(57) ABSTRACT

A frequency calibration method for a programmable oscillator includes the steps of: counting an oversampling number of an oversampling signal and estimating an accumulated bit number of a USB data stream according to the oversampling signal; calculating a difference between the oversampling number and M times of the accumulated bit number when the accumulated bit number is larger than or equal to a predetermined value; and determining a frequency calibration step of the oversampling signal according to the difference. The present invention further provides a frequency calibration device for a programmable oscillator.

35 Claims, 6 Drawing Sheets

|  | Low-speed Downstream ||||
|  | Next Transition || Paired Transition ||
|  | Each (ns) | Total (ns) | Each (ns) | Total (ns) |
|---|---|---|---|---|
| Host Driver Jitter | 2.0 | 2.0 | 1.0 | 1.0 |
| Host Frequency Tolerance(worst-case) | 1.7/bit | 12.0 | 1.7/bit | 24.0 |
| Source (Host) Jitter Total |  | 14.0 |  | 25.0 |
| Hub with Low-speed Device Jitter | 45.0 | 45.0 | 15.0 | 15.0 |
| Remaining (full-speed) Hubs' Jitter | 3.0 | 12.0 | 1.0 | 4.0 |
| Jitter Spec |  | 71.0 |  | 44.0 |
| Function Frequency Tolerance | 10.0/bit | 70.0 | 10.0/bit | 140.0 |
| Function Receiver Jitter Budget |  | 141.0 |  | 184.0 |

FIG. 3

| oversampling number | bit number | frequency range |
|---|---|---|
| 24 > x | 1 | 36MHz > x |
| 40 > x > 24 | 2 | 30MHz > x > 18MHz |
| 56 > x > 40 | 3 | 28MHz > x > 20MHz |
| 72 > x > 56 | 4 | 27MHz > x > 21MHz |
| 88 > x > 72 | 5 | 26.4MHz > x > 21.6MHz |
| 104 > x > 88 | 6 | 26MHz > x > 22MHz |
| x > 104 | 7 | x > 22.28MHz |

FIG. 4

| initial clock error | ideal 64 bits time | shortest time(ns) | longest time(ns) | min OS No. | max OS No. | clock min range(MHZ) | | clock max range(MHZ) | | up step | increased f (MHz) | | down step | decreased f (MHz) | | max error(%) |
|---|---|---|---|---|---|---|---|---|---|---|---|---|---|---|---|---|
| | | | | | | | | | | | min f | max f | | min f | max f | |
| 1.00% | 42667(ns) | 42483 | 42851 | 1007 | 1041 | 23.477 | 23.680 | 24.270 | 24.480 | 3 | 23.807 | 24.100 | -3 | 23.850 | 24.150 | 0.805 |
| 1.25% | 42667(ns) | 42483 | 42851 | 1005 | 1043 | 23.430 | 23.633 | 24.317 | 24.527 | 3 | 23.760 | 24.053 | -3 | 23.897 | 24.197 | 1.000 |
| 1.5% | 42667(ns) | 42483 | 42851 | 1002 | 1046 | 23.360 | 23.562 | 24.387 | 24.598 | 4 | 23.800 | 24.122 | -4 | 23.827 | 24.158 | 0.833 |
| 1.75% | 42667(ns) | 42483 | 42851 | 1000 | 1048 | 23.313 | 23.515 | 24.434 | 24.645 | 4 | 23.753 | 24.075 | -4 | 23.874 | 24.205 | 1.027 |
| 2% | 42667(ns) | 42483 | 42851 | 997 | 1051 | 23.243 | 23.445 | 24.504 | 24.716 | 5 | 23.793 | 24.094 | -5 | 23.854 | 24.166 | 0.861 |
| 2.25% | 42667(ns) | 42483 | 42851 | 995 | 1054 | 23.197 | 23.398 | 24.574 | 24.786 | 6 | 23.856 | 24.177 | -6 | 23.794 | 24.126 | 0.860 |
| 2.5% | 42667(ns) | 42483 | 42851 | 992 | 1056 | 23.127 | 23.327 | 24.620 | 24.833 | 6 | 23.787 | 24.107 | -6 | 23.840 | 24.173 | 0.888 |
| 2.75% | 42667(ns) | 42483 | 42851 | 990 | 1059 | 23.080 | 23.280 | 24.690 | 24.904 | 7 | 23.850 | 24.190 | -7 | 23.780 | 24.134 | 0.915 |
| 3% | 42667(ns) | 42483 | 42851 | 987 | 1061 | 22.010 | 23.209 | 24.737 | 24.951 | 7 | 23.780 | 24.119 | -7 | 23.827 | 24.181 | 0.917 |

FREQUENCY CALIBRATION DEVICE AND METHOD FOR PROGRAMMABLE OSCILLATOR

CROSS REFERENCE TO RELATED APPLICATION

This application claims the priority benefit of Taiwan Patent Application Serial Number 098139076, filed on Nov. 18, 2009, the full disclosure of which is incorporated herein by reference.

BACKGROUND

1. Field of the Invention

This invention generally relates to a data transmission structure and method and, more particular, to a frequency calibration device and method for automatically calibrating the oscillation frequency of a programmable oscillator according to a data stream.

2. Description of the Related Art

An oscillation circuit with external clock can be used to provide a clock signal, and the oscillation circuit conventionally uses an external precise clock component, such as a crystal resonator or a ceramic resonator, to provide a reference frequency to the oscillation circuit. However, the external precise clock component not only increases the system cost, the control chip of the oscillation circuit also needs one or two extra pins to be served as a communication interface to the precise clock component.

In addition to using the reference frequency provided by the external precise clock component, the control chip can also use such as a phase locked loop (PLL) or a delay locked loop (DLL) to match the internal frequency thereof with the data rate of received data stream. However, this method usually takes longer calibration time and thus is adapted to certain applications, such as USB devices.

Accordingly, it is necessary to provide a frequency calibration device and method that does not require an external precise clock component and can calibrate the oscillation frequency of a programmable oscillator quickly and automatically so as to solve the problems in the art.

SUMMARY

An object of the present disclosure is to provide a frequency calibration device and method for a programmable oscillator without the use of an external oscillator that can automatically calibrate the oscillation frequency of the programmable oscillator according to arbitrary packet types in a USB data stream received.

An object of the present disclosure is to provide a frequency calibration device and method for a programmable oscillator that can calibrate the oscillation frequency of the programmable oscillator during data transmission to prevent the frequency drift of the programmable oscillator caused by environmental changes.

The present invention provides a frequency calibration method for a programmable oscillator including the steps of: receiving a clock signal and a USB data stream; estimating an accumulated bit number of the USB data stream according to the clock signal and counting an oversampling number of the clock signal; comparing the oversampling number and M times of the accumulated bit number when the accumulated bit number is larger than or equal to a predetermined value; decreasing the frequency of the clock signal when the oversampling number is larger than the M times of the accumulated bit number; and increasing the frequency of the clock signal when the oversampling number is smaller than the M times of the accumulated bit number.

The present invention further provides a frequency calibration method for programmable oscillator for calibrating an oversampling signal sent from a programmable oscillator according to a USB data stream. The frequency calibration method includes the steps of: counting an oversampling number of the oversampling signal and estimating an accumulated bit number of the USB data stream according to the oversampling signal; calculating a difference between the oversampling number and M times of the accumulated bit number when the accumulated bit number is larger than or equal to a predetermined value; and determining a frequency calibration step of the oversampling signal according to the difference.

The present invention further provides a frequency calibration device for programmable oscillator for calibrating an oscillation frequency of a programmable oscillator according to a USB data stream. The frequency calibration device includes a processing unit and a controller. The processing unit counts an oscillation number of the programmable oscillator, estimates an accumulated bit number of the USB data stream according to the oscillation number and compares the oscillation number and M times of the accumulated bit number to output a frequency calibration step. The controller is coupled to between the processing unit and the programmable oscillator, and configured to calibrate the oscillation frequency of the programmable oscillator according to the frequency calibration step.

The frequency calibration device and method for a programmable oscillator of the present disclosure uses arbitrary packet types of the Universal Serial Bus (USB), for example, but not limited to, SETUP packet, DATA packet and OUT packet between the Idle state and the End-of-Packet (EOP) as a basis for frequency calibration, such that the use of an external precise clock component is not required. The frequency calibration device and method of the present disclosure is applicable to devices with Universal Serial Bus, such as the USB mouse.

BRIEF DESCRIPTION OF THE DRAWINGS

Other objects, advantages, and novel features of the present invention will become more apparent from the following detailed description when taken in conjunction with the accompanying drawings.

FIG. 3 shows the maximum jitter budget required in a low-speed transmission.

FIG. 4 shows the bit number corresponding to the oversampling number between adjacent transition edges of the USB data stream in the present invention.

FIG. 8 shows the maximum frequency errors after being calibrated once by the frequency calibration method of the present invention.

DETAILED DESCRIPTION OF THE EMBODIMENT

It should be noticed that, wherever possible, the same reference numbers will be used throughout the drawings to refer to the same or like parts.

According to the Universal Serial Bus Specification revision 1.1, the data rate tolerance for a low-speed USB device functioning normally is within ±1.5%, and including the data error of a USB host ±0.25% the data rate tolerance for a built-in oscillator in the low-speed USB device should be within ±1.25% for ensuring a USB interface functioning correctly. Therefore, if the oversampling frequency of a USB device is 24 MHz (i.e. 16 times oversampling ratio), the oscillation frequency of a built-in oscillator in the USB device has to be ranged within 24 MHz±300 KHz. It is appreciated that the oversampling frequency of a USB device is not limit to 24 MHz.

Figure 1:
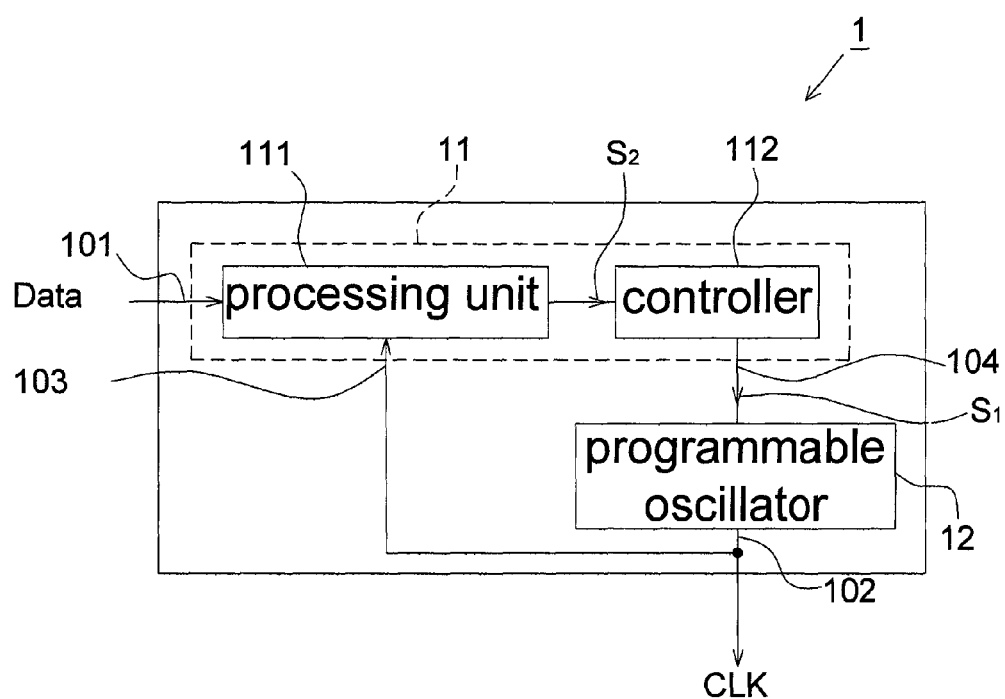
FIG. 1 shows a block diagram of the self-calibrating oscillator circuit according to an embodiment of the present invention.

Please refer to FIG. 1, it shows a self-calibrating oscillator circuit 1 according to an embodiment of the present invention, which includes an input terminal 101 and an output terminal 102. The self-calibrating oscillator circuit 1 may be built-in a USB device, such as a USB mouse, served as a local oscillator thereof and may generate a clock signal CLK with programmable frequency according to a USB data stream Data. The clock signal CLK may be, for example, an oversampling signal for the data recovery.

The input terminal 101 is configured to receive a data stream Data from a USB host, and to output a clock signal CLK from the output terminal 102. A difference between a frequency of the clock signal CLK and a data rate of the data stream Data may be calibrated within 0.805% and 1.027% of M times of data rate of the data stream Data, wherein M is a positive integer representing an oversampling ratio. The data stream Data may be arbitrary packet types in the USB data stream, such as SETUP packet, OUTPUT packet, DATA packet or other packet types. In one embodiment, the data stream Data for example may be a low-speed data stream with 1.5 MHz data rate.

The self-calibrating oscillator circuit 1 includes a frequency calibration device 11 and a programmable oscillator 12 coupled to each other. The programmable oscillator 12 may be for example a RC oscillator or any other suitable programmable oscillator. The frequency calibration device 11 receives a data stream Data of a USB host from the input terminal 101. The frequency calibration device 11 further includes a feedback input terminal 103 and a control output terminal 104. The frequency calibration device 11 receives the clock signal CLK feedback from the programmable oscillator 12 through the feedback input terminal 103, and outputs a control signal $S_1$ to the programmable oscillator 12 from the control output terminal 104, wherein the control signal $S_1$ may be for example a digital control signal including plural bits. The programmable oscillator 12 outputs a clock signal CLK to be served as a reference frequency of a USB device according to the control signal $S_i$.

The frequency calibration device 11 includes a processing unit 111 and a controller 112. The processing unit 111 counts an oversampling number (oscillation number) of the feedback clock signal CLK in a counting interval CI, and estimates an accumulated bit number of the data stream Data according to the oversampling signal. When the accumulated bit number is larger than or equal to a predetermined value, compare M times of the accumulated bit number and the oversampling number to output a frequency calibration step $S_2$, wherein the M is a quotient obtained from dividing an expecting oscillation frequency of the programmable oscillator 12 by a data rate of the data stream Data. That is, the M is an oversampling ratio for data recovery of the USB device. In an embodiment, the expecting oscillation frequency of the programmable oscillator 12 may be for example 24 MHz and the data rate of the data stream Data may be for example 1.5 MHz, and thus M is 16 herein. The counting interval CI is determined according to a value of the accumulated bit number, which is larger than or equal to the predetermined value.

The controller 112 is coupled to between the processing unit 111 and the programmable oscillator 112, and outputs the control signal $S_1$ according to the frequency modulation step $S_2$ to calibrate the oscillation frequency of the programmable oscillator 12, wherein one frequency modulation step is the frequency modulation resolution of the programmable oscillator 12 and it may be determined according to the actually utilized programmable oscillator.

Figure 2A:
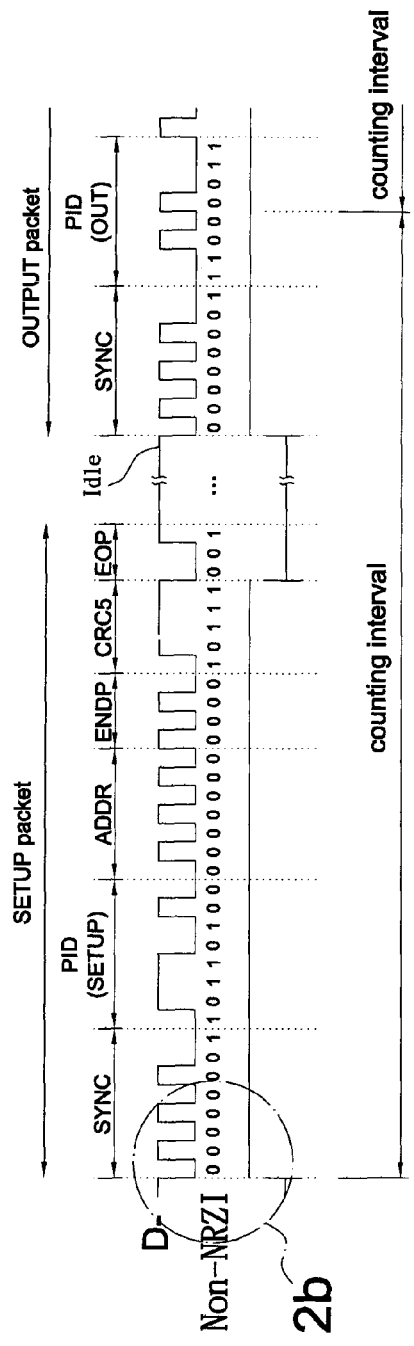
FIG. 2*a* shows a partial data stream outputted from a USB host.
Figure 2B:
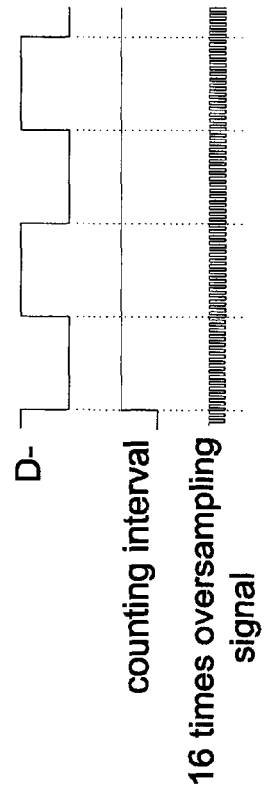
FIG. 2*b* shows a relational diagram of the oversampling signal of a USB device and the data stream shown in FIG. 2*a*.

Please refer to FIGS. 2a and 2b, FIG. 2a shows a schematic diagram of a partial data packet sent from a USB host to a USB device including a SETUP packet and a part of an OUTPUT packet herein, but actually it may include other packet types. FIG. 2b shows a partial enlargement diagram of FIG. 2a and a relation between 24 MHz oversampling frequency and 1.5 MHz data stream Data. That is, in this embodiment when the build-in oscillator of a USB device is in accurate operation, 16 oversampling points will be sampled in every bit slot of the data packet.

Please refer to FIGS. 1, 2a and 2b simultaneously, the processing unit 111 counts the bits between the first bit of the SYNC field and an immediately previous bit of the End-of-Packet of arbitrary packet types in the data stream Data in a counting interval CI and feedbacks the oversampling number of the clock signal CLK simultaneously, and compares their relationship to determine the frequency calibration step $S_2$ of the programmable oscillator 12. The controller 112 calibrates the oscillation frequency of the programmable oscillator 12 according to the frequency calibration step $S_2$, wherein a counting interval CI is assumed to include at least N bits. When a bit number from the SYNC field to an immediately previous bit of the End-of-Packet (the bits SYNC+PID+ADDR+ENDP+CRC5 shown in FIG. 2a) of the first data packet (e.g. SETUP packet) in the counting interval CI is less than N, the counting is temporarily stopped as receiving the End-of-Packet of the first data packet. And the counting will be restarted when the first bit of the SYNC field of a next data packet (the OUTPUT packet in FIG. 2a) is received again, and the counting will be stopped till the counting is larger than N.

Owing to the jitter existed in the data stream Data during transmission, the bit number included in every counting interval CI has to be able to tolerate the jitter budget of the worst case. Please refer to FIG. 3, it shows a data stream including consecutive ones passing through 5 serially cascaded HUBs. As the standard definition of the USB, one zero will be inserted after six consecutive ones, so called bit stuffing, and it is the worst case mentioned above. As shown in the figure, the paired transition has a largest timing jitter of 184 ns. In low-speed transmission, if the largest timing jitter is divided by the time slot of every bit in the data stream Data and the data rate tolerance (e.g. 184/(666.66×1.25%)=22.08 bits), it is able to obtain that a counting interval CI needs to contain at least 23 bits in the low-speed transmission to prevent the counting error. Details of FIG. 3 can be referred to Universal Serial Bus Specification, revision 1.1.

In the present invention, the method to estimate the bit number of a data stream Data in a counting interval CI is to estimate a bit number between adjacent transition edges and then to accumulate the bit number between consecutive adjacent transition edges. Because the coding method used in USB is Non Return to Zero (NRZI), at most six consecutive ones is possible. When consecutive one occurs in the data stream, no transition edge will appear between consecutive ones. Therefore, the present invention needs to estimate the number of bits within consecutive ones in the data stream.

Please refer to FIGS. 2a, 2b and 4 simultaneously, FIG. 4 shows the bit number corresponding to the oversampling number between adjacent transition edges in a USB data stream in the present invention. When the frequency error of the programmable oscillator 12 is calibrated within 3% before shipment, during estimating the bit number in the data stream Data according to the clock signal CLK, the processing unit 111 can estimate the bit number between adjacent transition edges according to FIG. 4. As shown in FIG. 4, when the oversampling number between two adjacent transition edges is less than 24, the processing unit 111 judges that there is only one bit between the two adjacent transition edges; when the oversampling number between two adjacent transition edges is between 24 and 40, the processing unit 111 judges that there are two bits between the two adjacent transition edges, and so on. Similarly, when the oversampling number between two adjacent transition edges is over 104, the processing unit 111 judges that there are seven bits between the two adjacent transition edges and the data stream includes six consecutive ones and one zero at this moment. In this manner, the processing unit 111 can estimate the bit number between two adjacent transition edges according to the oversampling number corresponding to the adjacent transition edges in the data stream Data, and accumulate the bit number between consecutive adjacent transition edges to obtain the accumulated bit number.

Figure 5:
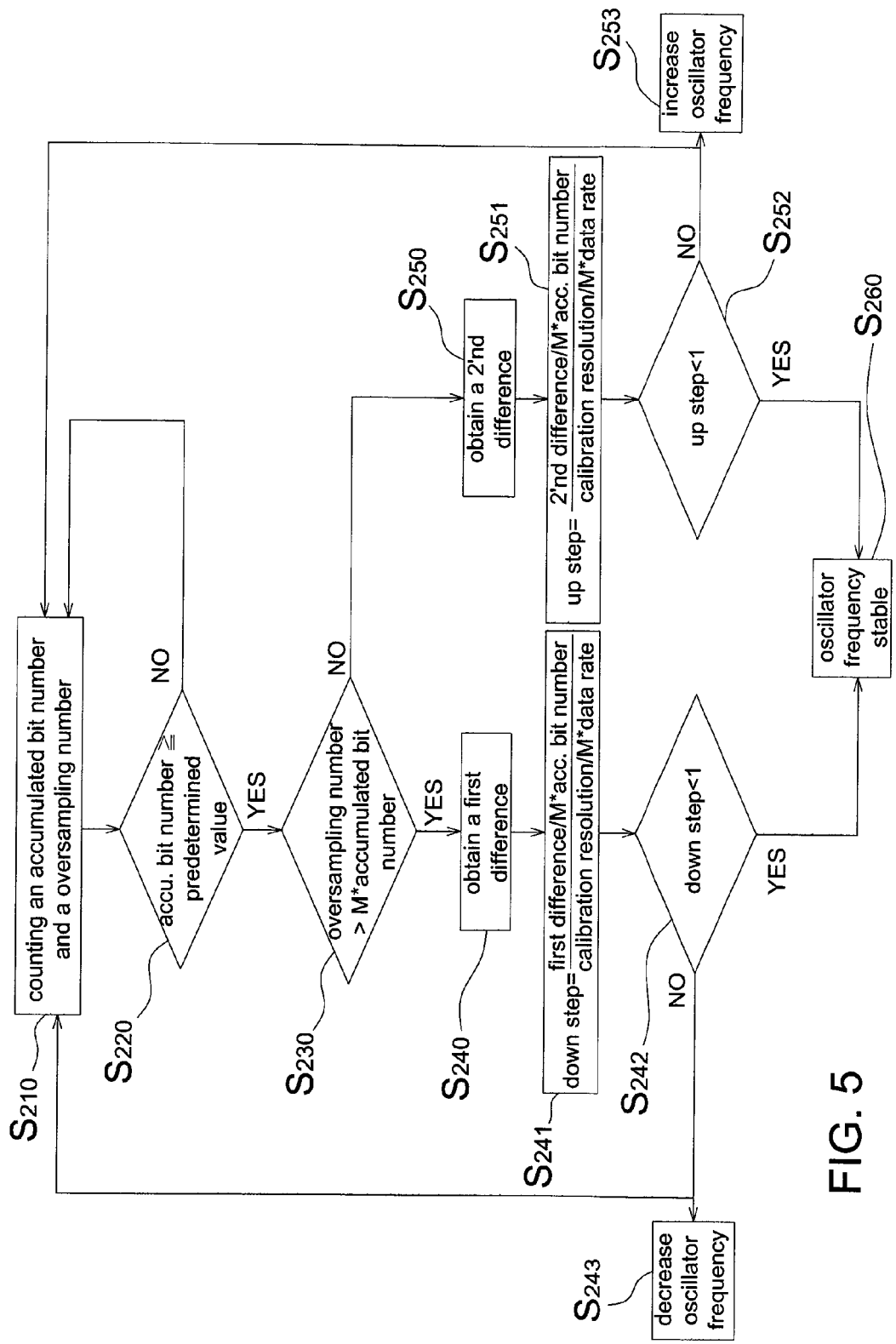
FIG. 5 shows a schematic diagram of the frequency calibration method for a programmable oscillator according to an embodiment of the present invention.

Please refer to FIGS. 1, 2a, 2b and 5 simultaneously, FIG. 5 shows a schematic diagram of the frequency calibration method for programmable oscillator according to an embodiment of the present invention. The processing unit 111 calibrates an oscillation frequency of the clock signal CLK generated by the programmable oscillator 12 according to a received USB data stream Data and a clock signal CLK.

Step $S_{210}$: The processing unit 111 receives a USB data stream and a clock signal, counts an oversampling number of the clock signal CLK and estimates an accumulated bit number in the data stream Data according to the oversampling number of the clock signal CLK, wherein the estimation of the accumulated bit number is irrelevant to the type of packet in the data stream Data. The processing unit 111 estimates a bit number between adjacent transition edges according to the corresponding oversampling number between the two adjacent transition edges in FIG. 4, and accumulates the bit number between consecutive adjacent transition edges to obtain the accumulated bit number.

Step $S_{220}$: The processing unit 111 judges whether the accumulated bit number is larger than or equal to a predetermined value, wherein the predetermined value is at least 23 according to FIG. 3. When the accumulated bit number is larger than or equal to the predetermined value, move to Step $S_{230}$.

Step $S_{230}$: The processing unit 111 judges whether the oversampling number is larger than M times of the accumulated bit number, wherein M is a quotient obtained from dividing an expecting oscillation frequency of the programmable oscillator 12 or a system frequency of the USB device by a data rate of the USB data stream, i.e. the oversampling ratio. For example in FIG. 2b, M is 16. When the oversampling number is larger than the M times of the accumulated bit number, move to steps $S_{240}$~$S_{243}$ to decrease the oscillation frequency of the clock signal CLK. When the oversampling number is smaller than the M times of the accumulated bit number, move to steps $S_{250}$~$S_{253}$ to increase the oscillation frequency of the clock signal CLK.

Step $S_{240}$: When the oversampling number is larger than the M times of the accumulated bit number, subtract the M times of the accumulated bit number from the oversampling number to obtain a first difference.

Step $S_{241}$: The processing unit 111 obtains a down step number and sends it to the controller 112, wherein the down step number is defined as a relationship (the first difference/M times of the accumulated bit number)/(the calibration resolution/M times of the data rate of the data stream) herein. One down step number, for example, may be the frequency calibration resolution of the programmable oscillator 12. For example in a low-speed transmission, M may be 16 and M times of the data rate of the data stream may be 24 MHz, but the present invention is not limited to this.

Step $S_{242}$: The processing unit 111 judges whether the down step number is less than 1. If it is, move to Step $S_{260}$; otherwise, move to Step $S_{243}$.

Step $S_{243}$: When the processing unit 111 judges the down step number is larger than 1, the down step number $S_2$ will be transmitted to the controller 112. The controller 112 then accordingly sends a control signal $S_1$ to decrease the oscillation frequency of the programmable oscillator 12. In the meanwhile, the processing unit 111 prepares to perform the next calibration from Step $S_{210}$. In one embodiment, a down step number may be associated with a frequency between 110 HHz~140 KHz, but is not limited to this. In one embodiment, when the calculated down step number is not a positive integer, round-off method can be applied to transform the down step number to a positive integer.

Step $S_{260}$: When the processing unit 111 judges the down step number is smaller than 1, it means the oscillation frequency of the programmable oscillator 12 is stable and no calibration will be performed. Then, the processing unit 111 restarts to count the oversampling number of the clock signal CLK from the next bit of the counted counting interval CI, to estimate the accumulated bit number of the USB data stream, and to perform a next calibration from Step $S_{210}$. It is appreciated that if the last bit in the counting interval CI is just at the last bit of CRC5 (refer to FIG. 2), the next counting interval will begin from the first bit of the SYNC field of next data packet.

Step $S_{250}$: When the oversampling number is smaller than the M times of the accumulated bit number, substrate the oversampling number from the M times of the accumulated bit number to obtain a second difference.

Step $S_{251}$: The processing unit 111 obtains a up step number and sends it to the controller 112, wherein the up step number is defined as a relationship (the second difference/M times of the accumulated bit number)/(the calibration resolution/M times of the data rate of the data stream. One up step number, for example, may be the frequency calibration resolution of the programmable oscillator 12.

Step $S_{252}$: The processing unit 111 judges whether the up step number is less than 1. If it is, move to Step $S_{260}$; otherwise, move to Step $S_{253}$.

Step $S_{253}$: When the processing unit 111 judges the up step number is larger than 1, the up step number $S_2$ will be transmitted to the controller 112. The controller 12 then accordingly sends a control signal $S_1$ to increase the oscillation frequency of the programmable oscillator 12. In the meanwhile, the processing unit 111 prepares to perform the next calibration from step $S_{210}$. In one embodiment, an up step number may be associated with a frequency between 110 KHz~140 KHz, but not limited to this. In one embodiment, when the calculated up step number is not a positive integers, round-off method can be applied to transform the up step number to a positive integer.

Figure 6:
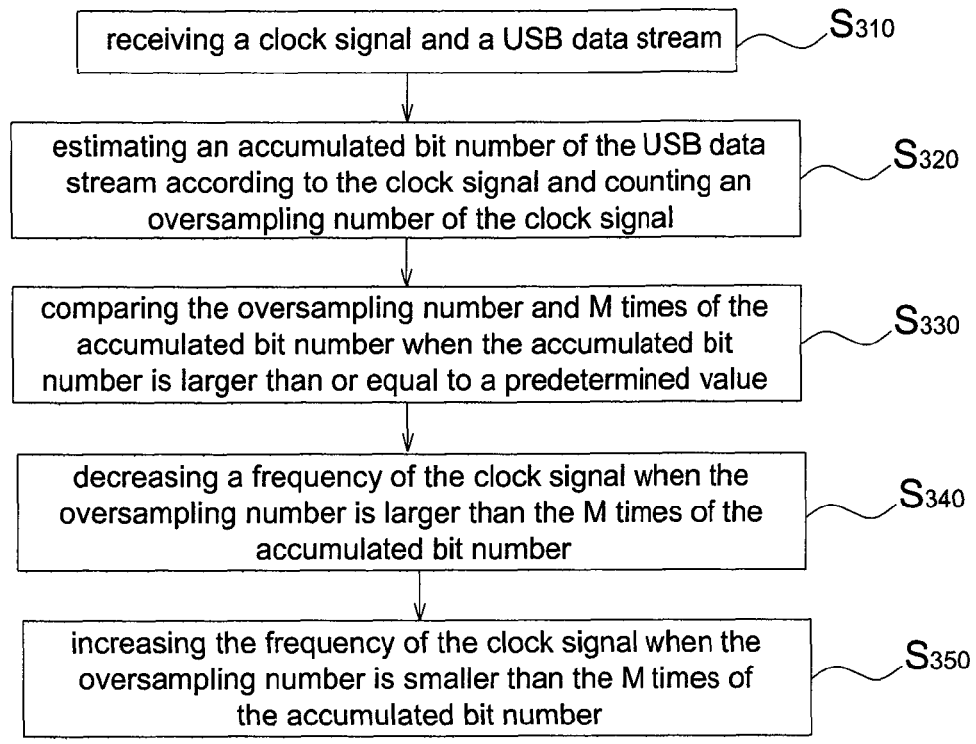
FIG. 6 shows a flow chart of the frequency calibration method for a programmable oscillator according to an embodiment of the present invention.

Therefore, the frequency calibration method for a programmable oscillator according to one embodiment of the present invention is shown in FIG. 6. The method includes the steps of: receiving a clock signal and a USB data stream (Step $S_{310}$); estimating an accumulated bit number of the USB data stream according to the clock signal and counting an oversampling number of the clock signal (Step $S_{320}$); comparing the oversampling number and M times of the accumulated bit number when the accumulated bit number is larger than or equal to a predetermined value (Step $S_{330}$); decreasing the frequency of the clock signal when the oversampling number is larger than the M times of the accumulated bit number (Step $S_{340}$); and increasing the frequency of the clock signal when the oversampling number is smaller than the M times of the accumulated bit number (Step $S_{350}$). Details of this embodiment have been shown in FIG. 5 and corresponding illustrations, and thus will not be repeated herein.

Figure 7:
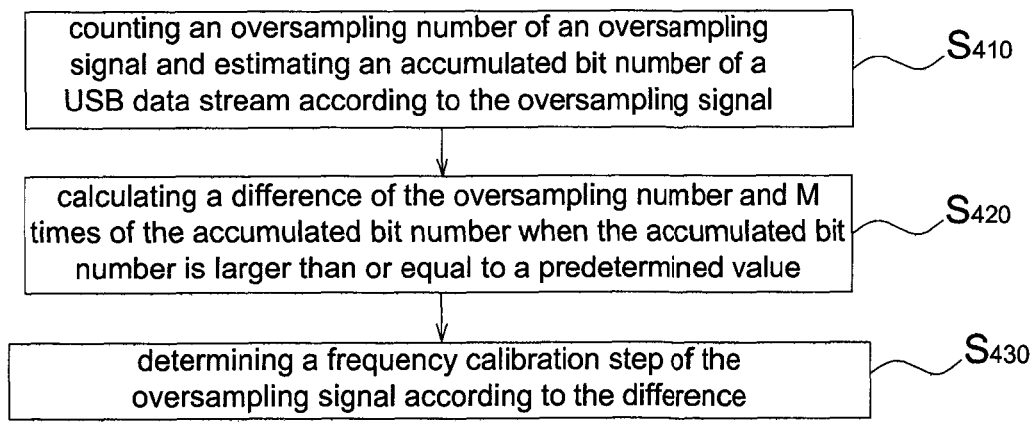
FIG. 7 shows a flow chart of the frequency calibration method for a programmable oscillator in another embodiment of the present invention.

FIG. 7 shows the frequency calibration method for a programmable oscillator according to another embodiment of the present invention. The frequency calibration method is configured to calibrate an oversampling signal sent from a programmable oscillator according to a USB data stream. The frequency calibration method includes the steps of counting an oversampling number of the oversampling signal and estimating an accumulated bit number of the USB data stream according to the oversampling signal (Step $S_{410}$); calculating a difference between the oversampling number and M times of the accumulated bit number when the accumulated bit number is larger than or equal to a predetermined value (Step $S_{420}$); and determining a frequency calibration step of the oversampling signal according to the difference (Step $S_{430}$).

Please refer to FIG. 8, it shows a maximum error of the programmable oscillator 12 after being calibrated once by the frequency calibration device and method of the present invention; wherein when an initial error is between 1% to 3%, the error after being calibrated once can be reduced to between 0.805% to 1.027%. In FIG. 8, for example the counting interval CI has two INPUT packets each including 32 bits (total 64 bits). A system frequency of a low-speed USB device (i.e. the oscillation frequency of the programmable oscillator 12) is assumed to be 24 MHz (i.e. the oversampling period is 41.667 nanosecond.), i.e. 16 times oversampling ratio. In the frequency calibration device and method for programmable oscillator of the present invention, the initial error is preferably calibrated within 3% to make the processing unit 111 estimate the correct bit number between adjacent transition edges according to FIG. 4. In addition, in this embodiment, the frequency calibration resolution of the programmable oscillator 12 is assumed between 110 KHz~140 KHz, but not limited to this.

The initial error of the programmable oscillator 12 is between 1% and 3%, which is shown in the first column of FIG. 8. And initial error of 1% is illustrated herein to explain the calculation method of the first row of FIG. 8, and since other rows have the same calculation method, detailed description will not be repeated again. In the second column, an ideal bit time of 64 bits is equal to 64×(1/1.5 MHz)=42,667 nanoseconds.

In the third column, the shortest bit time of 64 bits including jitter equals the ideal 64 bits time subtracts the maximum jitter time, i.e. 42,667−184=42,483 nanoseconds, wherein the maximum jitter time is referred to FIG. 3.

In the fourth column, the longest bit time of 64 bits including jitter equals the ideal 64 bits time adds the maximum jitter time, i.e. 42,667+184=42,851 nanoseconds.

The fifth column is the minimum oversampling number (min OS No.) in one counting interval CI that is (the shortest bit time×(1−the initial error)/the oversampling period)−the sampling error. In this embodiment, it is assumed that every data packet has one bit of sampling error, and thus the sampling error of two INPUT packets is two. The minimum oversampling number is equal to 42,483×(1−1%)/41.667)−2=1,007.

The sixth column is the maximum oversampling number (max OS No.) in one counting interval CI that is (the longest time×(1+the initial error)/the oversampling period)+the sampling error, i.e. 42,851×(1+1%)/41.667)+2=1,041.

The seventh and the eighth columns are respectively the minimum and the maximum values of the clock minimum rage, wherein the minimum value equals (the minimum oversampling number−1)×1000/the longest bit time, i.e. (1,007−1)×1,000/42,851=23.477 MHz; the maximum value equals (the minimum oversampling number−1)×1000/the shortest bit time, i.e. (1,007−1)×1,000/42,483=23.680 MHz.

The ninth and the tenth columns are respectively the minimum and the maximum values of the clock maximum rage, wherein the minimum value equals (the maximum oversampling number−1)×1000/the longest bit time, i.e. (1,041−1)×1,000/42,851=24.270 MHz; the maximum value equals (the maximum oversampling number−1)×1000/the shortest bit time, i.e. (1,041−1)×1,000/42,483=24.480 MHz.

The eleventh column is the up step relative to different initial errors.

The twelfth and the thirteenth columns are respectively the minimum and the maximum frequencies of the oscillation frequency after being increased. The minimum frequency=the minimum value of the clock minimum range+the up step×the minimum resolution, i.e. 23.477 MHz+3×110 KHz=23.807 MHz. The maximum frequency=the maximum value of the clock minimum range+the up step×the maximum resolution, i.e. 23.680 MHz+3×140 KHz=24.100 MHz.

The fourteenth column is the down step relative to different initial errors.

The fifteenth and the sixteenth columns are respectively the minimum and the maximum frequencies of the oscillation frequency after being decreased. The minimum frequency=the maximum value of the clock maximum range−the down step×the maximum resolution, i.e. 24.270 MHz−3×140 KHz=23.850 MHz. The maximum frequency=the maximum value of the clock maximum range−the down step×the minimum resolution, i.e. 24.480 MHz−3×110 KHz=24.150 MHz.

The seventeenth column is the maximum error of the oscillation frequency after being calibrated, the maximum error happens at the minimum frequency after being increased, that is 100%×(24−23.807)/24=0.805%.

It is appreciated that although a low-speed transmission is described in the present invention, it is only exemplary. The frequency calibration device and method of the present invention is not limited to the low-speed USB device.

As described above, the extra precise clock device used in conventional USB device has a higher cost and needs extra pins to communicate thereto. The present invention further provides a frequency calibration device and method for a programmable oscillator without external precise oscillator that can automatically and real-timely calibrate an oscillation frequency of a programmable oscillator according to the received arbitrary packet types in the USB data stream.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A frequency calibration method for a programmable oscillator, comprising:
   receiving a clock signal and a USB data stream;
   estimating an accumulated bit number of bits between a first bit of a SYNC field and a bit immediately preceding an End-of-Packet of a data packet in the USB data stream according to the clock signal and counting an oversampling number of the clock signal;
   comparing the oversampling number and M times of the accumulated bit number when the accumulated bit number is larger than or equal to a predetermined value;
   decreasing the frequency of the clock signal when the oversampling number is larger than the M times of the accumulated bit number; and
   increasing the frequency of the clock signal when the oversampling number is smaller than the M times of the accumulated bit number.

2. The frequency calibration method as claimed in claim 1, wherein the predetermined value is at least 23.

3. The frequency calibration method as claimed in claim 1, wherein the estimating includes
   estimating a bit number between adjacent transition edges according to the oversampling number corresponding to the adjacent transition edges in the USB data stream; and
   accumulating the bit number between consecutive adjacent transition edges to obtain the accumulated bit number.

4. The frequency calibration method as claimed in claim 1, wherein M is a quotient obtained from dividing an expecting frequency of the clock signal by a data rate of the USB data stream.

5. The frequency calibration method as claimed in claim 1, wherein in the estimating, an estimation of the accumulated bit number is irrelevant to a type of packet in the data stream.

6. The frequency calibration method as claimed in claim 1, wherein the USB data stream employs NRZI data encoding.

7. A frequency calibration method for a programmable oscillator, for calibrating an oversampling signal sent from the programmable oscillator according to a USB data stream, the method comprising:
   counting an oversampling number of the oversampling signal;
   estimating an accumulated bit number of bits between a first bit of a SYNC field and a bit immediately preceding an End-of-Packet of the USB data stream according to the oversampling signal;
   calculating a difference between the oversampling number and M times of the accumulated bit number when the accumulated bit number is larger than or equal to a predetermined value; and
   determining a frequency calibration step of the oversampling signal according to the difference.

8. The frequency calibration method as claimed in claim 7, wherein the predetermined value is at least 23.

9. The frequency calibration method as claimed in claim 7, wherein the estimating includes
   estimating a bit number between adjacent transition edges according to the oversampling number corresponding to the adjacent transition edges in the USB data stream; and
   accumulating the bit number between consecutive adjacent transition edges to obtain the accumulated bit number.

10. The frequency calibration method as claimed in claim 7, further comprising:
    calibrating the oversampling signal of the programmable oscillator when the frequency calibration step is larger than 1; and
    maintaining the oversampling signal of the programmable oscillator when the frequency calibration step is smaller than 1.

11. The frequency calibration method as claimed in claim 7, wherein one frequency calibration step is a frequency calibration resolution of the programmable oscillator.

12. The frequency calibration method as claimed in claim 11, wherein the frequency calibration step is defined as a relationship (the difference between the oversampling number and M times of the accumulated bit number/the M times of the accumulated bit number)/(the frequency calibration resolution/M times of the data rate of the USB data stream.

13. The frequency calibration method as claimed in claim 7, wherein M is a quotient obtained from dividing an expecting oversampling frequency of the programmable oscillator by a data rate of the USB data stream.

14. The frequency calibration method as claimed in claim 7, wherein in the estimating, an estimation of the accumulated bit number is irrelevant to a type of packet in the data stream.

15. The frequency calibration method as claimed in claim 7, wherein the USB data stream employs NRZI data encoding.

16. A frequency calibration device for a programmable oscillator, for calibrating an oscillation frequency of the programmable oscillator according to a USB data stream, the device comprising:
    a processing unit configured to count an oscillation number of the programmable oscillator, estimate an accumulated bit number of bits between a first bit of a SYNC field and a bit immediately preceding an End-of-Packet of the USB data stream according to the oscillation number, and compare the oscillation number and M times of the accumulated bit number to output a frequency calibration step; and
    a controller coupled to between the processing unit and the programmable oscillator and configured to calibrate the oscillation frequency of the programmable oscillator according to the frequency calibration step.

17. The frequency calibration device as claimed in claim 16, wherein the USB data stream is an arbitrary packet type outputted from a USB host.

18. The frequency calibration device as claimed in claim 16, wherein one frequency calibration step is a frequency calibration resolution of the programmable oscillator.

19. The frequency calibration device as claimed in claim 18, wherein the frequency calibration step is defined as a relationship (a difference between the M times of the accumulated bit number and the oscillation number/the M times of the accumulated bit number)/(the frequency calibration resolution/M times of the data rate of the USB data stream).

20. The frequency calibration device as claimed in claim 16, wherein M is a quotient obtained from dividing an expecting oscillation frequency of the programmable oscillator by a data rate of the USB data stream.

21. The frequency calibration device as claimed in claim 16, wherein the USB data stream employs NRZI data encoding.

22. A frequency calibration method for a programmable oscillator, comprising:
receiving a clock signal and a USB data stream;
counting an oversampling number of the clock signal;
estimating a bit number between adjacent transition edges according to the oversampling number corresponding to the adjacent transition edges in the USB data stream and accumulating the bit number between consecutive adjacent transition edges to obtain an accumulated bit number;
comparing the oversampling number and M times of the accumulated bit number when the accumulated bit number is larger than or equal to a predetermined value;
decreasing the frequency of the clock signal when the oversampling number is larger than the M times of the accumulated bit number; and
increasing the frequency of the clock signal when the oversampling number is smaller than the M times of the accumulated bit number.

23. The frequency calibration method as claimed in claim 22, wherein the predetermined value is at least 23.

24. The frequency calibration method as claimed in claim 22, wherein M is a quotient obtained from dividing an expecting frequency of the clock signal by a data rate of the USB data stream.

25. A frequency calibration method for a programmable oscillator, for calibrating an oversampling signal sent from the programmable oscillator according to a USB data stream, the method comprising:
counting an oversampling number of the oversampling signal;
estimating a bit number between adjacent transition edges according to the oversampling number corresponding to the adjacent transition edges in the USB data stream and accumulating the bit number between consecutive adjacent transition edges to obtain an accumulated bit number;
calculating a difference between the oversampling number and M times of the accumulated bit number when the accumulated bit number is larger than or equal to a predetermined value; and
determining a frequency calibration step of the oversampling signal according to the difference.

26. The frequency calibration method as claimed in claim 25, wherein the predetermined value is at least 23.

27. The frequency calibration method as claimed in claim 25, further comprising:
calibrating the oversampling signal of the programmable oscillator when the frequency calibration step is larger than 1; and
maintaining the oversampling signal of the programmable oscillator when the frequency calibration step is smaller than 1.

28. The frequency calibration method as claimed in claim 25, wherein one frequency calibration step is a frequency calibration resolution of the programmable oscillator.

29. The frequency calibration method as claimed in claim 25, wherein the frequency calibration step is calculated according to an equation of (the difference between the oversampling number and M times of the accumulated bit number/the M times of the accumulated bit number)/(the frequency calibration resolution/M times of the data rate of the USB data stream).

30. The frequency calibration method as claimed in claim 25, wherein M is a quotient obtained from dividing an expecting oversampling frequency of the programmable oscillator by a data rate of the USB data stream.

31. A frequency calibration device for a programmable oscillator, for calibrating an oscillation frequency of the programmable oscillator according to a USB data stream, the device comprising:
a processing unit configured to count an oscillation number of the programmable oscillator, estimate a bit number between adjacent transition edges according to the oscillation number corresponding to the adjacent transition edges in the USB data stream, and accumulate the bit number between consecutive adjacent transition edges to obtain an accumulated bit number and comparing the oscillation number and M times of the accumulated bit number to output a frequency calibration step; and
a controller coupled to between the processing unit and the programmable oscillator and configured to calibrate the oscillation frequency of the programmable oscillator according to the frequency calibration step.

32. The frequency calibration device as claimed in claim 31, wherein the USB data stream is an arbitrary packet type outputted from a USB host.

33. The frequency calibration device as claimed in claim 31, wherein one frequency calibration step is a frequency calibration resolution of the programmable oscillator.

34. The frequency calibration device as claimed in claim 31, wherein the frequency calibration step is calculated according to an equation of (a difference between the M times of the accumulated bit number and the oscillation number/the M times of the accumulated bit number)/(the frequency calibration resolution/M times of the data rate of the USB data stream).

35. The frequency calibration device as claimed in claim 31, wherein M is a quotient obtained from dividing an expecting oscillation frequency of the programmable oscillator by a data rate of the USB data stream.

* * * * *